US011075512B1

(12) United States Patent
Noonan

(10) Patent No.: US 11,075,512 B1
(45) Date of Patent: Jul. 27, 2021

(54) SMART ELECTRICAL SYSTEM FOR MONITORING AND CONTROL OF ELECTRICAL INTERFACES

(71) Applicant: Darrell Noonan, Colver, PA (US)

(72) Inventor: Darrell Noonan, Colver, PA (US)

( * ) Notice: Subject to any disclaimer, the term of this patent is extended or adjusted under 35 U.S.C. 154(b) by 199 days.

(21) Appl. No.: 16/280,251

(22) Filed: Feb. 20, 2019

(51) Int. Cl.
*H02H 1/00* (2006.01)
*G01R 21/133* (2006.01)
*G06Q 50/06* (2012.01)
*H01H 83/20* (2006.01)
*H01H 71/00* (2006.01)

(52) U.S. Cl.
CPC ......... *H02H 1/0061* (2013.01); *G01R 21/133* (2013.01); *G06Q 50/06* (2013.01); *H01H 83/20* (2013.01); *H01H 2071/006* (2013.01); *H01H 2300/03* (2013.01)

(58) Field of Classification Search
CPC ............. H01H 83/20; H01H 2071/006; H01H 2300/03; H02H 1/0061; G01R 21/133; G06Q 50/06
See application file for complete search history.

(56) References Cited

U.S. PATENT DOCUMENTS

| 2014/0177738 A1* | 6/2014 | Alshinnawi | H02J 13/00017 375/257 |
| 2015/0207301 A1* | 7/2015 | Franks | H01H 71/123 361/634 |
| 2019/0179276 A1* | 6/2019 | Asp | H02J 13/00004 |

\* cited by examiner

*Primary Examiner* — Kyle J Moody
*Assistant Examiner* — Lakaisha Jackson
(74) *Attorney, Agent, or Firm* — Sanchelima & Associates, P.A.; Christian Sanchelima; Alexander Rodriguez

(57) ABSTRACT

The present invention is a smart electrical system comprising a smart control panel connected to various electrical interfaces. Each electrical interface is inbuilt with at least one IC chip to identify it. The smart control panel comprises a processing unit to process information from various electrical interfaces and load connected to each electrical interface. The processed information is displayed on the display unit, as at least one menu list, that allows the user to select and control various electrical interfaces from panel itself. The smart control panel allows the user to reset the circuit breaker box in case if it is tripped due to overload. The panel monitors each electrical interface and alerts user when overload or marginal load condition occurs.

9 Claims, 3 Drawing Sheets

SMART ELECTRICAL SYSTEM FOR MONITORING AND CONTROL OF ELECTRICAL INTERFACES

BACKGROUND OF THE INVENTION

1. Field of the Invention

The present disclosure relates to a smart control panel used in electrical systems for remote and local monitoring and control of electrical interfaces in residential and commercial buildings. More particularly, the present disclosure relates to a smart electrical system having Integrated Circuit (IC) chip inbuilt in each of the electrical interface.

2. Description of the Related Art

Residential and commercial buildings have at least one box with circuit breaker connected to main power for supplying power to various loads. In case of any overload condition, the circuit breaker disconnects power to loads. Many devices and systems are in use to monitor various loads and electrical interfaces in the buildings.

Applicant believes that a related reference corresponds to US patent application US20090206059A1 filed by Simply Automated Inc for intelligent circuit breaker apparatus and methods. This cited disclosure comprises a system and associated components for providing an intelligent circuit breaker being adapted to communicate with, monitor and control various devices within commercial or residential premises. In one embodiment, the system is adapted for low cost, ease of installation and operation, and ease of manufacture. The intelligent circuit breaker may also be adapted to send data relating to sensed parameter or conditions to, and receive commands from, a user interface. Methods for operating such breakers and converting existing circuit breakers to intelligent circuit breakers consistent with the aforementioned system and components are also described.

Applicant believes that a related reference corresponds to US patent application US20120265586A1 filed by Rutgers State University of New Jersey for a system and method to measure and control power consumption in a residential or commercial building via a wall socket to ensure optimum energy usage therein. This cited disclosure comprises system and method that includes a power measurement and control device electrically connected to one of the electrical circuits by which a load draws power that is operable to (i) measure an electrical parameter of the electrical circuits, (ii) compare the measured electrical parameter to an ideal electrical parameter, and (iii) adjust power supplied to one or more of the electrical circuits based on the comparison of the measured electrical parameter and the ideal electrical parameter via a wall socket.

Applicant believes that a related reference corresponds to PCT patent application WO1993023760A1 A1 filed by SQUARE D CO for a system, monitoring circuit breaker operations and alerting need of preventative maintenance. This cited disclosure comprises a system which automatically monitors critical circuit breaker operating parameters during each operation of the circuit breaker. Monitored parameters include the currents being interrupted, trip coil voltage and current, position of the contacts, initiation of closing, over travel of the contact mechanism on closing, contact opening and closing point and pressure in SF6 circuit breakers. These parameters are sampled and stored in memory in the circuit breaker. The sample memory is connected to a local microcomputer which is in communication with a host computer. Upon receipt of a command from the host computer a local microcomputer in the circuit breaker transmits the sample data to the host computer for storage and analysis. The host computer compares the stored data for each operation with acceptable operation curves. If the data indicates operation outside of various acceptable ranges, the maintenance department is automatically notified of the potential problem, to allow preventative maintenance and further testing, if desired.

Other documents describing the closest subject matter provide for a number of more or less complicated features that fail to solve the problem in an efficient and economical way. None of these patents suggest the novel features of the present invention.

SUMMARY OF THE INVENTION

It is an object of the present invention to provide a smart control panel used in electrical system for remote and local monitoring of electrical interfaces and loads in residential and commercial buildings. The electrical interfaces are for example, light switches, electrical and electronic appliance outlets or switch boards.

It is an object of the present invention to provide a smart electrical system in which each of the electrical interface is inbuilt with an IC chip. The IC chip is used to identify any electrical interface in the system and power consumed by load connected in the circuit.

It is yet another object of the present invention to provide a smart electrical system comprising a control panel or computer used to monitor various electrical interfaces in electrical system of a building and provide warning to user when load connected to electrical interfaces is overloaded or approaches overload condition.

It is yet another object of the present invention to provide a smart electrical system comprising a control panel or computer used to reset circuit breaker from control panel itself, when circuit breaker is tripped due to overload condition.

It is yet another object of the present invention to provide a smart electrical system comprising a control panel or computer used to view specification, wiring and circuit configuration of electrical interfaces on display unit.

It is yet another object of the present invention to provide a smart electrical system comprising a control panel used to troubleshoot visually, any error in the electrical system.

Further objects of the invention will be brought out in the following part of the specification, wherein detailed description is for the purpose of fully disclosing the invention without placing any limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

Figure 1:
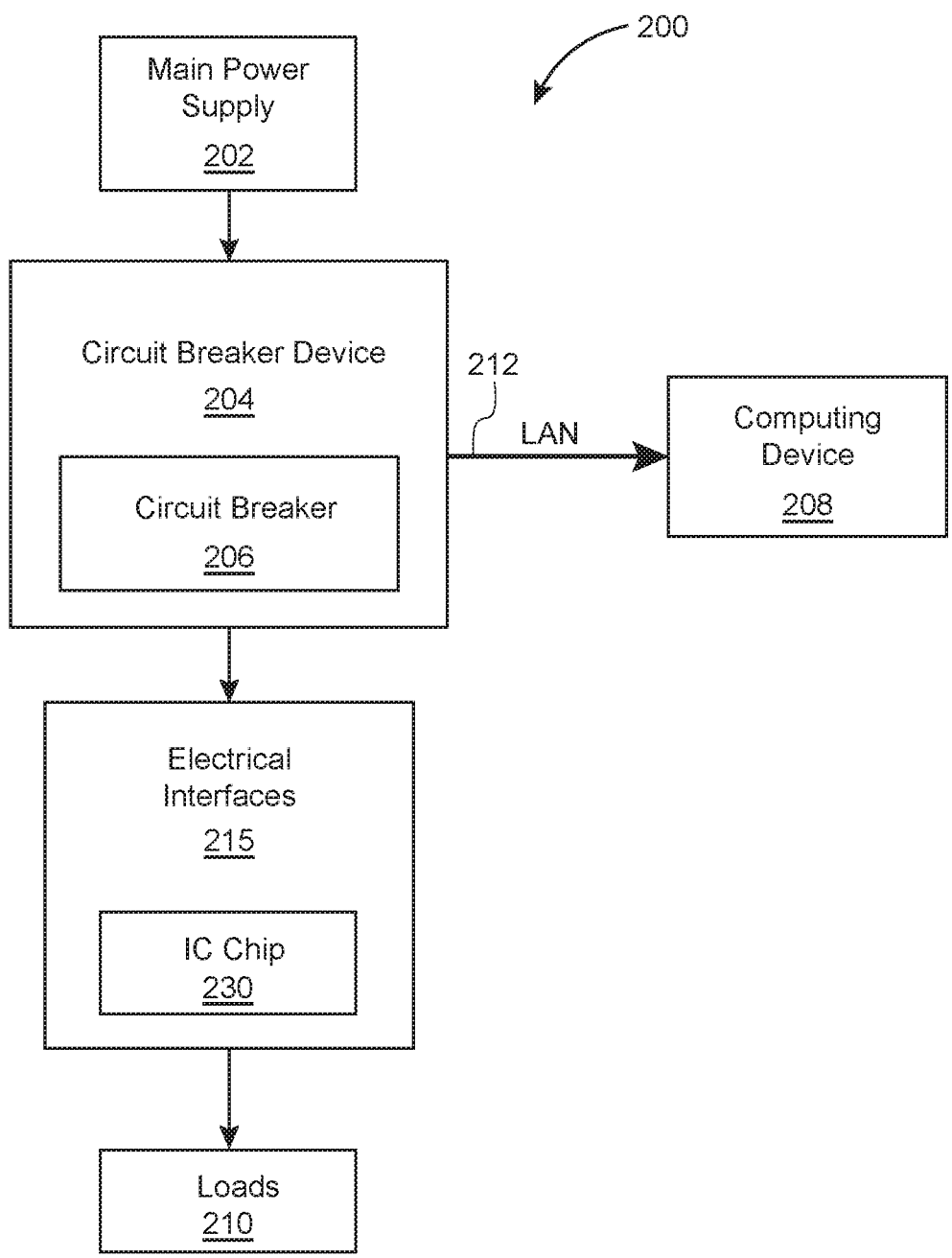
FIG. 1 represents a block diagram of an electrical system 200 connected to a computing device 208 using a Local Area Network (LAN) 212 for monitoring and controlling various electrical interfaces 215 and loads 210 connected to the electrical interfaces 215.

Referring to FIG. 1 represents a block diagram of a smart electrical system 200 comprising a circuit breaker device 204 connected to a computing device 208 using a Local Area Network (LAN) 212 for monitoring various electrical interfaces 215 and loads 210 connected to the electrical interfaces 215. The user can monitor various load usage in each electrical interface 215 on computing device 208 and accordingly control the load 210 to avoid overload conditions. The circuit breaker device 204 has a circuit breaker 206 connected to main power supply 202, supplying power to various loads 210. System 200 can send warning message to computing device 208, when supplies are overloaded or approaches marginal upper limit. In case when circuit breaker 206 in circuit breaker device 204 is tripped, user can accordingly reduce the load consumption and reset the circuit breaker 206. Using the computing device 208, the user can schedule various load operation, view electrical interfaces specification and configuration and view wiring information. The computing device 208 can be connected to circuit breaker box or device 204, either using wired or wireless technology, not limited to wired or wireless LAN or Wireless Fidelity (Wi-Fi). The computing device 208 can identify each of the electrical interface 215 connected to the system 200 by using IC chip 230 built in it.

The loads 210 can be any of electrical appliances used in the building, for example, lights, fans, air conditioners and so on. The electrical interfaces 215 can be not limited to switches, light switches, power outlets and junction boxes. The computing device 200, is not limited to a personal computer, laptop, personal digital assistance, mobile phone, tablet and the like. Use of computing device 208, allows user to remotely monitor various electrical interfaces 215 and electrical power consumed by various loads 210 connected to electrical interfaces 215 in electrical system. In one another embodiment of the invention, the computing device 208 can monitor and control circuit breaker 206 and various electrical interfaces 215, either locally or remotely. In one embodiment of the invention, the computing device 208 is a smart control panel.

In should be noted that the computing device 208 is installed with at least one software program that allows user to retrieve information from electrical interfaces 215. The software program also allows the user to select various operational options and send appropriate control signal to circuit breaker device 204 or electrical interface 215.

Figure 2:
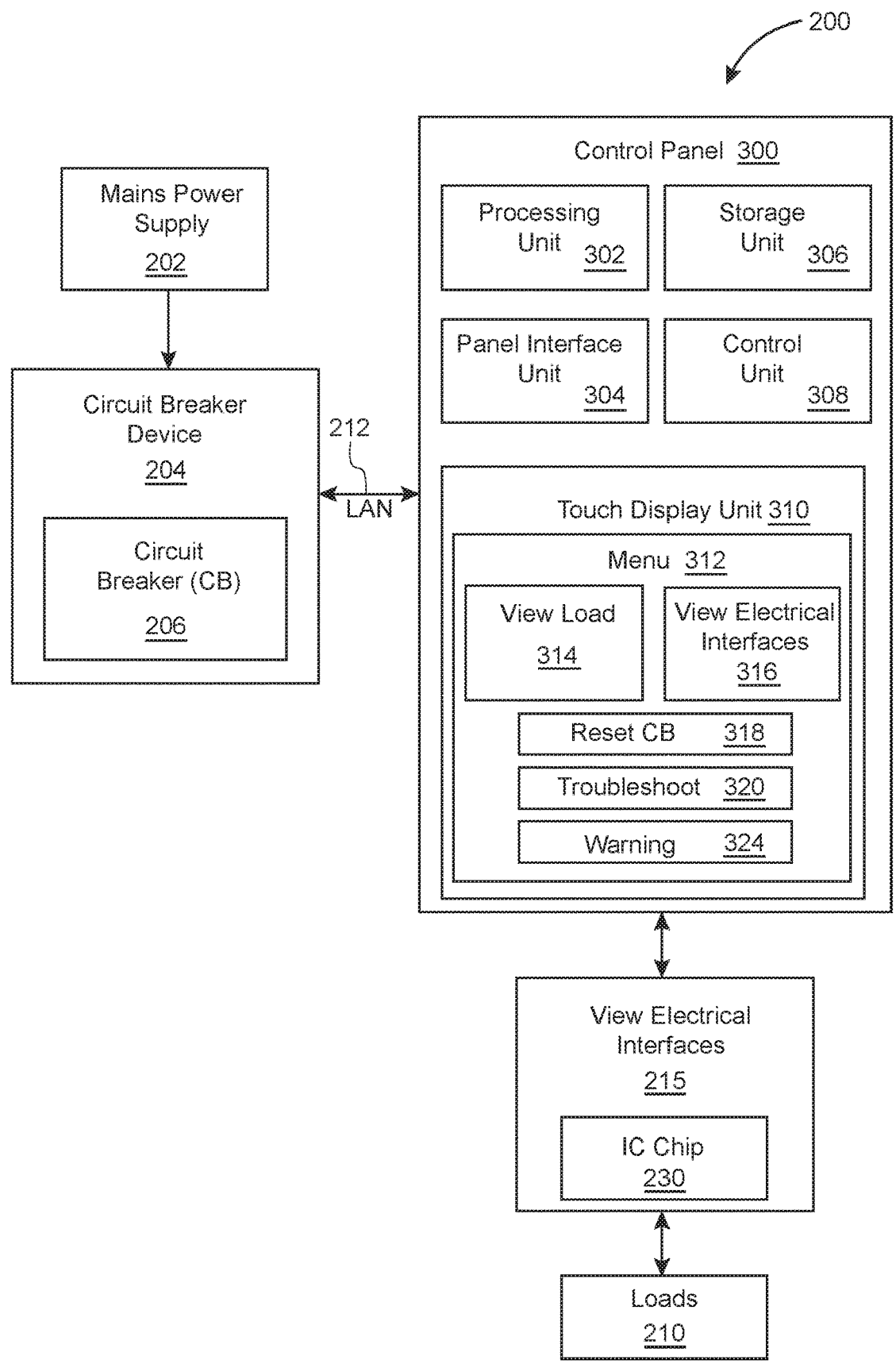
FIG. 2 represents a block diagram of a smart electrical system 200 connected to a smart control panel 300 for monitoring and controlling various electrical interfaces 215 and loads 210 connected to the electrical interfaces 215. The system 200 warns user when supplies are overloaded or approaches marginal upper limit. The panel 300 identifies each of the electrical interface 215 using an IC chip 230 inbuilt in it. The user can view and select load usage information 314, electrical interfaces information 316, troubleshooting options 320, circuit breaker reset options 318 on touch display unit 310.

FIG. 2 represents a block diagram of a smart electrical system 200 connected to a smart control panel 300 for monitoring various electrical interfaces 215 and loads 210 connected to the electrical interfaces 215 and warns user when overload occurs or approaches overload condition. IC chip 230 built in each electrical interfaces 215 is used to identify each of the electrical interfaces 215 connected to circuit breaker 206. The control panel 300 is used to monitor and control electrical interfaces 215 and electrical circuit breaker device 204. The control panel 300 comprises at least one processing unit 302 to process data from electrical interfaces 215 and loads 210, at least one storage unit 306 to store data processed by processing unit 302, at least one touch display unit 310 to display data from storage unit 306, at least one control unit 308 to control the electrical interfaces 215 and loads 210 based on data processed by processing unit 302 and at least one panel interface unit 304 to interface the control unit 308 with the electrical interfaces 215 and to interface the control unit 308 with the electrical circuit breaker device 204. The storage unit 306 can be a memory of any type.

The touch display unit 310 shows a menu 312 comprises various options for example, view electrical interface information 316, view load information 314, circuit breaker reset option 318 and error troubleshooting option 320. The user can select one option in the menu 312 and get the detailed information. Each option in menu 312 can have a sub menu. The load information 314 is not limited to current load used, unused load, load specification, load schedule option, average usage of each load and so on. The electrical interface information 316 is not limited to, circuit configuration of each electrical interface 215, specification of each electrical interface 215, wiring information of each electrical interface 215 from circuit breaker 206, load 210 connected to each electrical interface 215 and so on. In case of any error in the system 200, the user can troubleshoot using troubleshoot option 320. The panel 300 displays at least one warning message 324 to user in case of any error or overload conditions.

The smart control panel 300 can be installed in suitable place that is easily accessible by user in the building. A building can have one or more smart control panel 300 in one or more floor. This allows the user to easily view load usage information, can perform load scheduling operation, view each circuit information in electrical system, and view each electrical interface specification, circuit configuration and wiring information, on the touch display unit 310.

Control unit 308 controls various the electrical interfaces 215 based on the load schedule selected by user. For example, user can schedule number of lights that should be turned on in evening for a predetermined period of time. Control unit 308 also controls circuit breaker 206, when it is tripped due to overload conditions.

When a new electrical interface 215 is installed in the system, using the IC chip 230 in electrical interface 215, its overall details and load 210 connected to it are retrieved and used by the processing unit 302. The processing unit 302 processes the information in each IC chip 230 and information of load connected to each electrical interfaces 215 and display as various options on touch display unit 310. The user can view and select load information, electrical interface information, circuit information, wiring information, troubleshooting options and circuit breaker reset options on touch display unit 300. The system 200 uses panel interfacing unit 304 to interface various hardware and software devices in the system 200. The information listed in menu 312 are not limited to shown in FIG. 2, other information related to wiring, electrical interface, remote control devices, mobile control devices or adapters are also possible.

Figure 3:
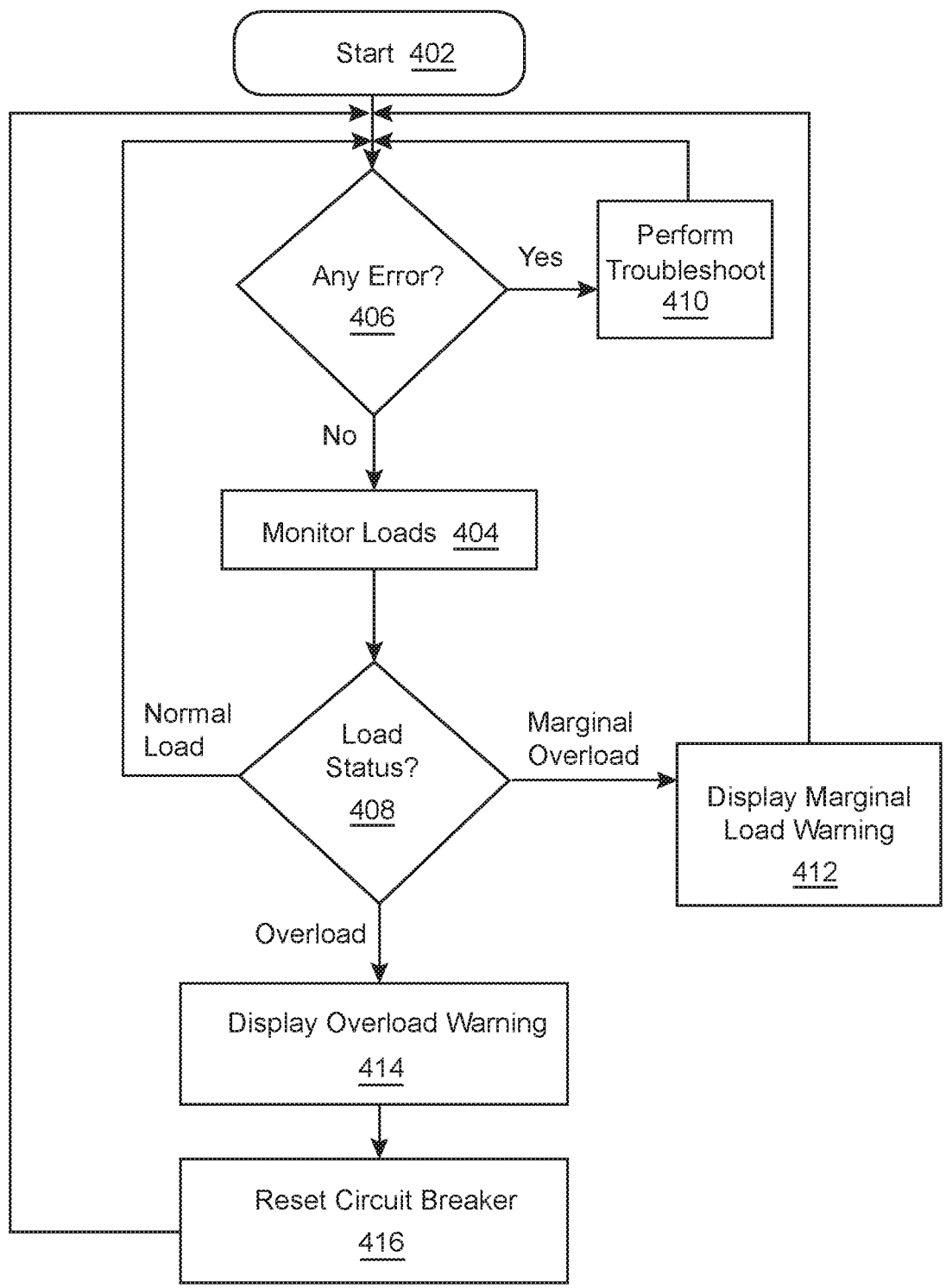
FIG. 3 shows a flow chart showing smart electrical system 200 for FIG. 2 used for monitoring and controlling each electrical interfaces 215 and loads 210 connected to the electrical interfaces 215. The user can also troubleshoot any error occurred during working of smart electrical system 200.

FIG. 3 shows a flow chart showing smart electrical system 200 used for monitoring various electrical interfaces 215 and troubleshooting error, during working of system 200. As at the steps 402 and 406, when control panel 300 is turned on, over all working of system 200 is checked. As at step 410, in case any error in the system 200, a warning message is displayed on the touch display unit 310 and the user can troubleshoot using troubleshooting option 320 available in the menu 312. It should be noted that the panel 300 can be turned on permanently or can be used during required period of time.

As at steps 404 and 408, the system 200 monitors load connected to each of the electrical interface and checks the load status continuously. The load status can be obtained based on the information obtained by identifying each electrical interface 215 using IC chip 230 and calculating the loads that are connected to it. If the load status is normal, the system 200 continues to monitor electrical interface 215 and loads connected to it. If overall load is reaching upper marginal load, the system 200 display warning message 324 to user intimating that the load is near maximum capacity, as at step 412. This allows the user to cut down some of the loads.

As at step 414, in case of overload condition, the circuit breaker 206 will trip and power to various loads 210 will be cut down. The panel 300 is directly connected to the main power supply 202 and this always keeps the panel 300 working irrespective of circuit breaker 206 working. The user is displayed with the warning message 324 about the overload and the user can reset the circuit breaker 206 using the circuit breaker reset option 318 available in the menu 312, without physically resetting it. The control unit 308 sends reset signal to circuit breaker device or box 204, to regain power.

The main advantage of using IC chip 230 in each electrical interface 215 is that, each devices/interface, for example, light switch, electrical power outlets, circuit switch boards and the like used in the electrical system 200 of the building, can be easily identified by the processing unit 302 of the control panel 300 or computing device 208. Device or interface information will allow the user to view the manufacturing and part number on display unit 310. This allows the user to purchase new device or interface incase of any damage or non-working of any electrical interfaces 215.

As all the electrical interface 215 information are accessed using the IC chip 230, the present invention also allows viewing of each circuitry in the building. In case any circuitry is fault or not working, the display unit 310 shows the fault circuitry and the user can easily locate the fault. Further, the present invention also shows the user the distance between various electrical interfaces 215 and gauge size used in the wiring. The overall wiring configuration is displayed to user in which wiring of different electrical interface 215 from the circuit breaker 206 are shown in different colors. This allows the user to view wiring configuration easily and repair any wiring related issues. In older homes, the control panel can be first installed in the exiting old electrical system and then later, while replacing old electrical interfaces, new electrical interface with IC chip can be installed/upgraded in the system.

The user can monitor and control each electrical interface 215 from the panel 300 itself. The user can view status of loads 210, whether used or not used from the control panel 300, by selecting appropriate option in menu 312, for example under sub menu of view electrical interface option 316, the user can schedule operation of each load by specifying when each load should be turned ON or OFF.

The present invention displays user a complete wiring schematic of the building. In case when the building has IC chip 230 enabled electrical interfaces 215 but not have smart panel 300 or computing device 208, any suitable computing device can be used to retrieve the information from each chip 230 and use in convenient computing or electrical device installed with suitable software program, that allows user to view wiring and electrical interface information.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A smart electrical system for monitoring and controlling at least one electrical interface and power consumed by loads connected to the at least one electrical interface in residential and commercial buildings, comprising:
   a. at least one circuit breaker device connected to a main power supply, wherein the at least one circuit breaker device comprises at least one circuit breaker;
   b. at least one integrated circuit chip built in each electrical interface to identify the at least one electrical interface connected to the at least one circuit breaker; and
   c. at least one computing device to monitor and control the at least one electrical interface and the at least one circuit breaker device, wherein the at least one computing device is connected to the at least one circuit breaker device using at least one wired or wireless network, wherein said at least one computing device includes at least one processor and at least one storage unit containing instructions that are readable by said at least one processor and causing the at least one computing device to continuously update a load status obtained from the at least one electrical interface via communication with an IC chip coupled to the at least one electrical interface and calculating the load status, wherein said load status is determined to be one of a normal load status, a marginal overload status, or an overload status, wherein a marginal load warning is displayed on the at least one computing device when the load status is determined to be the marginal overload status, wherein an overload warning is displayed on the at least one computing device when the load status is determined to be the overload status, wherein the at least one circuit breaker is reset when the overload warning is displayed on the at least one computing device.

2. The smart electrical system of claim 1, wherein the at least one computing device is a computer.

3. The smart electrical system of claim 1, wherein the at least one computing device is a control panel.

4. The smart electrical system of claim 3, wherein the control panel comprises at least one display unit to display an operational menu to user.

5. The smart electrical system of claim 4, wherein the operation menu comprises various options for user selection.

6. The smart electrical system of claim 5, wherein various options comprises electrical interfaces information, load information, wiring information, electrical interfaces specification, circuit breaker reset option and error troubleshooting option.

7. The smart electrical system of claim 4, wherein the at least one display unit displays at least one warning message to user when overload condition occurs.

8. The smart electrical system of claim 1, wherein the at least one electrical interface comprises electrical appliance switches, power outlets or switch boards connected to the at least one circuit breaker.

9. A smart electrical system for monitoring and controlling at least one electrical interface and power consumed by loads connected to the at least one electrical interface in residential and commercial buildings, consisting of:
  a. at least one circuit breaker device connected to a main power supply, wherein the at least one circuit breaker device comprises at least one circuit breaker;
  b. at least one integrated circuit chip built in the at least one electrical interface to identify the at least one electrical interface connected to the at least one circuit breaker; and
  c. at least one smart control panel to monitor and control the at least one electrical interface and the at least one circuit breaker device, wherein the at least one smart control panel consists of:
    at least one processing unit to process data to and from the at least one electrical interface and the at least one electrical circuit breaker device;
    at least one storage unit to store data processed by the at least one processing unit;
    at least one touch display unit to display data from the at least one storage unit; wherein the at least one touch display unit displays at least one operation menu to user, wherein the at least one touch display unit displays a schematic and wiring information of the residential and commercial buildings;
    at least one control unit to control the at least one electrical interface and the at least one circuit breaker device based on data processed by the at least one processing unit;
    at least one panel interface unit to interface the at least one control unit with the at least one electrical interface and to interface the at least one control unit with the at least one circuit breaker device, wherein the at least one smart control panel is connected to the at least one circuit breaker device using at least one of a wired or wireless network; and
  wherein the at least one processor and the at least one storage unit contains instructions that are readable by said at least one processor and causing the at least one computing device to continuously update a load status obtained from the at least one electrical interface via communication with an IC chip coupled to the at least one electrical interface and calculating the load status, wherein said load status is determined to be one of a normal load status, a marginal overload status, or an overload status, wherein a marginal load warning is displayed on the at least one computing device when the load status is determined to be the marginal overload status, wherein an overload warning is displayed on the at least one computing device when the load status is determined to be the overload status, wherein the at least one circuit breaker is reset when the overload warning is displayed on the at least one computing device.

* * * * *